(12) United States Patent
Lee

(10) Patent No.: US 10,344,372 B2
(45) Date of Patent: Jul. 9, 2019

(54) DEPOSITING APPARATUS AND METHOD FOR MANUFACTURING ORGANIC LIGHT EMITTING DIODE DISPLAY USING THE SAME

(71) Applicant: SAMSUNG DISPLAY CO., LTD., Yongin-si, Gyeonggi-Do (KR)

(72) Inventor: Sang-Shin Lee, Yongin (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 1533 days.

(21) Appl. No.: 13/965,297

(22) Filed: Aug. 13, 2013

(65) Prior Publication Data

US 2014/0106482 A1   Apr. 17, 2014
US 2018/0212203 A9   Jul. 26, 2018

(30) Foreign Application Priority Data

Oct. 12, 2012 (KR) .......................... 10-2012-0113500

(51) Int. Cl.
| | |
|---|---|
| *C23C 14/24* | (2006.01) |
| *H01L 51/56* | (2006.01) |
| *H01L 21/67* | (2006.01) |
| *H01L 51/00* | (2006.01) |
| *C23C 14/12* | (2006.01) |
| *C23C 14/22* | (2006.01) |

(52) U.S. Cl.
CPC ............ *C23C 14/243* (2013.01); *C23C 14/12* (2013.01); *C23C 14/225* (2013.01); *C23C 14/24* (2013.01); *H01L 21/6715* (2013.01); *H01L 21/67017* (2013.01); *H01L 51/001* (2013.01); *H01L 51/56* (2013.01)

(58) Field of Classification Search
CPC ................ C23C 14/243; C23C 14/225; C23C 14/24–325
USPC .................................................. 118/726, 727
See application file for complete search history.

(56) References Cited

U.S. PATENT DOCUMENTS

| | | | |
|---|---|---|---|
| 2004/0115338 A1* | 6/2004 | Yoneda ................. | C23C 14/042 427/66 |
| 2009/0229524 A1 | 9/2009 | Kim et al. | |
| 2010/0134719 A1* | 6/2010 | Johns ..................... | C23C 14/02 349/62 |

(Continued)

FOREIGN PATENT DOCUMENTS

| | | | |
|---|---|---|---|
| KR | 10-2006-0101987 A | 9/2006 | |
| KR | 10 2010-0108086 A | 10/2010 | |

(Continued)

*Primary Examiner* — Aiden Lee
(74) *Attorney, Agent, or Firm* — Lee & Morse, P.C.

(57) ABSTRACT

A deposition apparatus includes a deposition source containing a deposition material, the deposition source including a center area between two outer areas along a first direction, and a plurality of spray nozzles arranged on the center area of the deposition source along the first direction, the plurality of spray nozzles being configured to spray the deposition material toward a surface substrate, wherein the spray nozzles include first and second spray nozzles, the first spray nozzles having terminal ends thereof parallel to and facing the surface of the substrate, and the second spray nozzles having terminal ends thereof at an oblique angle with respect to the surface of the substrate.

20 Claims, 7 Drawing Sheets

(56) References Cited

U.S. PATENT DOCUMENTS

2011/0005462 A1* 1/2011 Yanagi .................... C23C 14/12
                                                    118/726
2012/0141674 A1   6/2012 Park et al.
2012/0237679 A1* 9/2012 Madigan ............... C23C 14/042
                                                    427/248.1

FOREIGN PATENT DOCUMENTS

KR    10-2011-0017517 A   2/2011
KR    10 2011-0059965 A   6/2011
KR    10 2011-0071649 A   6/2011

* cited by examiner

DEPOSITING APPARATUS AND METHOD FOR MANUFACTURING ORGANIC LIGHT EMITTING DIODE DISPLAY USING THE SAME

CROSS-REFERENCE TO RELATED APPLICATION

This application claims priority to and the benefit of Korean Patent Application No. 10-2012-0113500, filed in the Korean Intellectual Property Office on Oct. 12, 2012, the entire contents of which are incorporated herein by reference.

BACKGROUND OF THE INVENTION

1. Field of the Invention

Example embodiments relate to a deposition apparatus and a manufacturing method of an organic light emitting diode (OLED) display using the same, and in particular, to a deposition apparatus configured to prevent a shadow phenomenon by controlling a spray angle of a deposition material and a manufacturing method of an OLED display using the same.

2. Description of the Related Art

Among display devices, an OLED display, which exhibits a wide viewing angle, excellent contrast, and a fast response speed, has been receiving attention as one of the next generation display elements. In general, the OLED includes an emission layer between an anode and a cathode, such that holes and electrons generated in the anode and the cathode are recombined in the emission layer for light emission, thereby realizing a color. However, in such a structure, it may be difficult to obtain high efficiency light emission when an additional middle layer, e.g., an electron injection layer (EIL), an electron transport layer (ETL), a hole transport layer (HTL), and/or a hole injection layer (HIL), is selectively added and inserted between each electrode and the emission layer.

The above information disclosed in this Background section is only for enhancement of understanding of the background of the invention and therefore it may contain information that does not form the prior art that is already known in this country to a person of ordinary skill in the art.

SUMMARY

Example embodiments provide a deposition apparatus that increases an incident angle of a deposition material on a substrate.

Also, the example embodiments provide a manufacturing method of an OLED display that increases deposition uniformity and deposition efficiency.

A deposition apparatus according to the example embodiments includes a deposition source containing a deposition material, the deposition source including a center area between two outer areas along a first direction, and a plurality of spray nozzles arranged on the center area of the deposition source along the first direction, the plurality of spray nozzles being configured to spray the deposition material toward a surface substrate, wherein the spray nozzles include first and second spray nozzles, the first spray nozzles having terminal ends thereof parallel to and facing the surface of the substrate, and the second spray nozzles having terminal ends thereof at an oblique angle with respect to the surface of the substrate.

A center of the substrate in the first direction and a center of the deposition source in the first direction may be aligned, and the center area of the deposition source may have a length L1 in the first direction as follows:

$$L_1 = \frac{2T}{\tan\theta} - L_2$$

wherein L2 is a deposition area length at the substrate in the first direction, T is a distance between the substrate and an end of the spray nozzle, and θ is the oblique angle.

The oblique angle may be formed to be included in a range of about 43°-53°.

The oblique angle may be formed to be included in a range of about 25°-35°.

The spray nozzles may include a first column in which the first spray nozzle is arranged in the first direction and a second column in which the second spray nozzle is arranged in the first direction, and the first column and the second column may be arranged in parallel in the second direction crossing the first direction.

The spray nozzles may be symmetrically arranged in the first direction with reference to the center of the deposition source.

A manufacturing method of an OLED display according to the example embodiments includes providing a deposition apparatus including a deposition source receiving a deposition material and a plurality of spray nozzles arranged in a first direction at one side of the deposition source and spraying the deposition material to a substrate; disposing a substrate to face the spray nozzles; and spraying the deposition material through the spray nozzles while moving the deposition source in a second direction crossing the first direction, wherein the deposition source is divided into a center area and outer areas at both ends of the center area with reference to the first direction, the spray nozzles are arranged at the central area and include a first spray nozzle including a surface forming an end parallel to a surface of the substrate and a second spray nozzle including a surface forming an end while forming an oblique angle with the surface of the substrate in the first direction and formed toward an outer direction of the deposition source.

A center of the substrate in the first direction and a center of the deposition source in the first direction may be aligned, and the center area of the deposition source may have a length L1 in the first direction as follows:

$$L_1 = \frac{2T}{\tan\theta} - L_2$$

wherein L2 is a deposition area length at the substrate in the first direction, T is a distance between the substrate and an end of the spray nozzle, and θ is the oblique angle.

The oblique angle may be formed to be included in a range of 43-53 degrees.

The oblique angle may be formed to be included in a range of 25~35 degrees.

The spray nozzle may include a first column in which the first spray nozzle is arranged in the first direction and a second column in which the second spray nozzle is arranged in the first direction, and the first column and the second column may be arranged in parallel in a second direction crossing the first direction.

The spray nozzle may be symmetrically arranged in the first direction with reference to the center of the deposition source.

DETAILED DESCRIPTION

Figure 1:
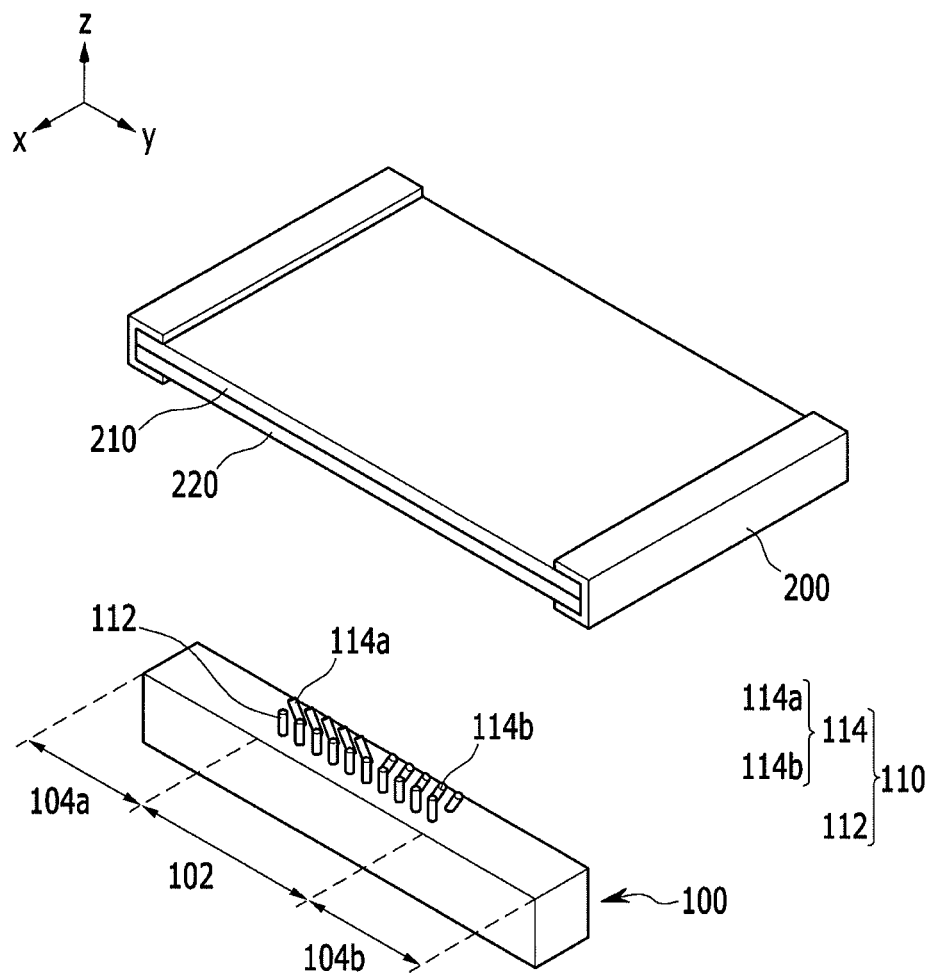
FIG. 1 is a perspective view of a deposition apparatus according to an exemplary embodiment.

Hereafter, a deposition apparatus and a manufacturing method of an OLED display according to example embodiments will be described with reference to the accompanying drawings. As those skilled in the art would realize, the described embodiments may be modified in various different ways, all without departing from the inventive spirit or scope. On the contrary, exemplary embodiments introduced herein are provided to make disclosed contents thorough and complete and to sufficient transfer the inventive spirit to those skilled in the art. Like reference numerals designate like elements throughout.

In addition, unless explicitly described to the contrary, the word "comprise" and variations such as "comprises" or "comprising" will be understood to imply the inclusion of stated elements but not the exclusion of any other elements. Further, throughout this specification, the word "on" will be understood to be positioned above or below a target portion, and will be not necessarily be understood to be positioned at an upper side based on a gravity direction.

FIG. 1 is a perspective view of a deposition apparatus according to an exemplary embodiment.

For convenience of description, although a chamber is not shown in each drawing, all constituent elements of FIG. 1 are disposed in a vacuum chamber in which the degree of vacuum is properly maintained. The vacuum chamber may have various shapes according a shape of a processed substrate. For example, in the case where the processed substrate has a circular shape, the vacuum chamber has a cylindrical shape, and in the case where the processed substrate has a rectangular shape, the vacuum chamber has a cubic shape. In addition, the vacuum chamber may further include a vacuum pump (not shown) which discharges gas in the vacuum chamber to lower pressure in the vacuum chamber, a venting means (not shown) which injects a gas into the vacuum chamber to increase the pressure in the vacuum chamber, and the like.

Referring to FIG. 1, a deposition source 100 is a means of discharging a deposition material to deposit the deposition material on a substrate 210, and includes a space (not shown) for storing the deposition material, e.g., an organic material, therein. The storing space of the deposition material may be made of a ceramic material, e.g., alumina ($Al_2O_3$) and aluminum nitride (AlN), having excellent thermal radiation, but is not limited thereto and may be made of various materials having excellent thermal radiation and thermal resistance. A heater (not shown) configured to contact and surround an outer surface may be provided at the outer surface of the storing space of the deposition material, and serves to heat and vaporize the stored deposition material. The deposition source 100 is elongated in a first direction, e.g., along the y-axis, of the facing substrate 210. The deposition source 100 is divided into a center area 102 and outer areas 104 at both ends of the center area 102 with respect to the first direction.

A spray nozzle 110 spraying the deposition material is formed at one side of the deposition source 100 facing the substrate 210. The spray nozzle 110 has a circular tube shape and is connected to an inner space of the deposition source 100, thereby spraying the deposition material that is vaporized or sublimated from the inner space of the deposition source 100 toward the substrate 210. The spray nozzle 110 is provided in plural and is disposed in the center area 102 of the deposition source 100. A detailed description of the spray nozzle 110 will be provided below.

For example, a plurality of spray nozzles 110 is arranged along the first direction, e.g., along the y-axis, on the deposition source 100. For example, the substrate 210 may be formed with a plate shape, e.g., a rectangular shape, and the plurality of spray nozzles 110 is linearly arranged along the first direction to be parallel to one edge of the substrate 210.

The spray nozzles 110 are divided into first spray nozzles 112 and second spray nozzles 114 according to an arrangement position. For example, the first spray nozzles 112 may be substantially perpendicular to the substrate 210, so terminal ends thereof may be parallel to a surface of the substrate 210. In other words, the tube-shaped portions of the first spray nozzles 112 may be substantially perpendicular to the substrate 210, so the openings of the tube-shaped portions, i.e., portions emitting the deposition material, may face the substrate 210 and may be parallel to the substrate 210. For example, the second spray nozzles 114 may be inclined at an oblique angle with respect to the substrate 210, i.e., the tube-shaped portions of the second spray nozzles 114 may be inclined, so terminals ends thereof, i.e., the openings of the tube-shaped portions, may be at an oblique angle with respect to the substrate 210. As such, the second spray nozzles 114 may face an outer direction of the deposition source 100 while forming an oblique angle with of the substrate 210.

The substrate 210 is fixed to face the deposition source 100 by the substrate fixing unit 200. Since the substrate fixing unit 200 stably fixes the substrate 210, while forming a thin layer on the substrate 210, and carries out the substrate 210 after the processing is completed, the substrate fixing unit 200 has a structure that is capable of easily attaching to and detaching from the substrate 210. The substrate 210 is fixed to the substrate fixing unit 200 along the deposition mask 220 to form a pattern of an organic layer on the substrate 210. An opening is formed between shield parts of the organic material, such that the organic material may be deposited on the substrate 210 through the opening. Since the configuration of the substrate fixing unit 200 is the same as the configuration used in a general depositing apparatus, the detailed description thereof is omitted. The center of the substrate 210, e.g., as determined along the first direction, is arranged and disposed to correspond to, e.g., align with, the center the deposition source 100, e.g., as determined along the first direction.

The deposition source 100 and the substrate 210 may move relative to each other when the deposition is performed. For example, when the substrate 210 is fixed, the deposition source 100 may move in the second direction, e.g., in the x-axis direction, crossing the first direction so that the deposition source 100 moves a predetermined distance from or toward the substrate 210. When the deposition source 100 is disposed to emit the deposition material in a vertical direction, the substrate 210 may be disposed in parallel to the deposition source 100. When the deposition source 100 is disposed to emit the deposition material in a horizontal direction, the substrate 210 may be disposed vertically. For example, the deposition source 100 may be disposed at a bottom surface of a vacuum chamber, and the substrate 210 may be horizontally disposed parallel thereto but is not limited to the above.

Figure 2:
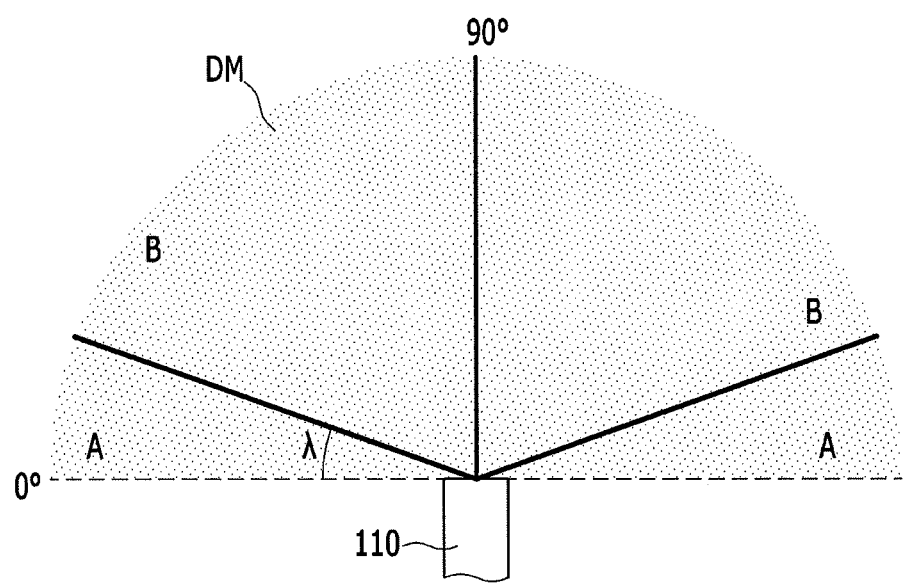
FIG. 2 and FIG. 3 are schematic views showing a distribution of a deposition material that is sprayed from a spray nozzle in a deposition apparatus according to an exemplary embodiment.
Figure 3:
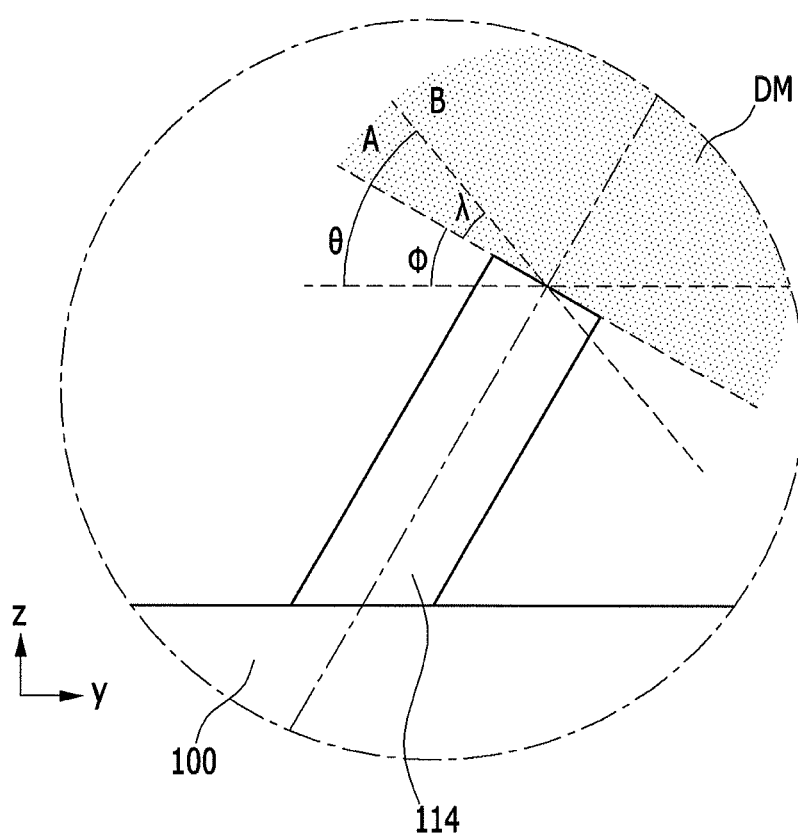

Before explaining the spray direction of the spray nozzle 110, a distribution of the deposition material sprayed from the spray nozzle will be described with reference to FIGS. 2-3. FIGS. 2-3 are schematic views of a distribution of a deposition material sprayed from the spray nozzles 110 in a deposition apparatus according to an exemplary embodiment. For convenience, the deposition mask 220 on the substrate 210 is omitted.

Referring to FIG. 2, a deposition material DM sprayed from the spray nozzle 110 is sprayed in vacuum, so the deposition material DM is spread at an angle of about 0°-90° with reference to an end cross-section of the spray nozzle 110 in all directions of a front side. For example, in FIG. 2, the end cross-section refers to the solid line indicating an edge of the spray nozzle 110 that faces the deposition material DM. Accordingly, it is preferable to consider the angle of the end cross-section of the spray nozzle 110 rather than a formation angle of the spray nozzle 110. If a spray area, i.e., where the deposition material DM is sprayed, is divided into an area A and an area B according to the spread angle of the deposition material DM and a distribution ratio, Table 1 provides an explanation thereof as follows.

TABLE 1

| Spray area division | Spread angle (°) | Distribution ratio (%) |
|---|---|---|
| A | 0-18 | 0.054 |
| B | 18-90 | 99.946 |

As the spray angle is increased from 0°, a deposition amount of the deposition material is increased. When the spray angle reaches 90°, the deposition amount is maximal. As seen in Table 1, the deposition amount is steeply increased once the spray angle is larger than about 18°. Therefore, the area A is an area having a spray angle from 0° to 18° with reference to the end cross-section of the spray nozzle 110, and the area B is an area having a spray angle from 18° to about 90°. The deposition material DM distributed into area A corresponds to about 0.054% of the sprayed deposition material DM, and the influence of the deposition material DM in the area A is relatively small for the substrate 210. On the other hand, the deposition material DM distributed into area B corresponds to about 99.946% of the sprayed deposition material DM, i.e., a main portion of the deposition material DM deposited onto the substrate 210. As such, area B having a spray angle of about 18°-90° is defined as an effective spray area. The effective spray area is not limited thereto, and may be changed according to a kind of the deposition material. By considering an angle λ corresponding to area A, determining an angle of the end cross-section of the spray nozzle 110 for the substrate 210 will be described later.

Figure 4:
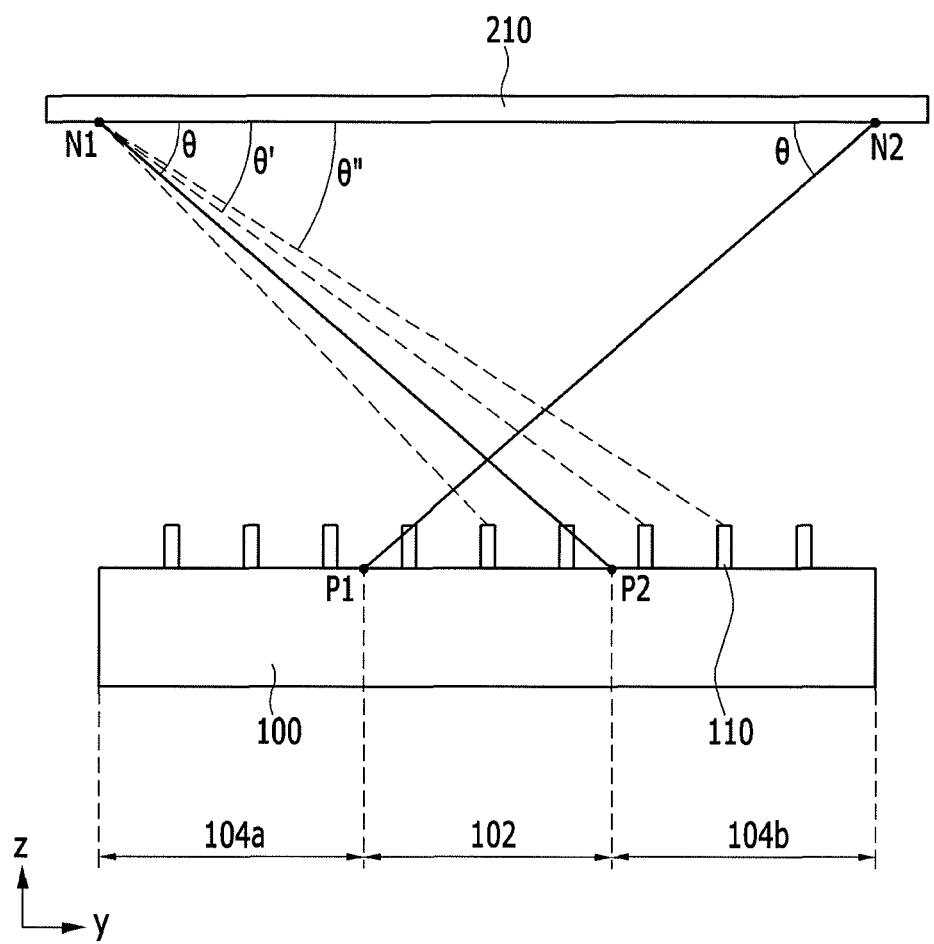
FIG. 4 is a schematic view showing a correlation of a position between an incident angle of a deposition material that is deposited on a substrate and a spray nozzle in a deposition apparatus according to an exemplary embodiment.

FIG. 4 is a schematic view showing a correlation between an incident angle of the deposition material DM deposited on the substrate 210 and a position of the spray nozzle 110 in the deposition apparatus 100.

When the deposition material DM is deposited on the substrate 210, the deposition material DM is deposited while forming a predetermined angle (θ) with the substrate 210 with reference to the first direction. In this case, a minimum incident angle of the deposition material DM is determined by considering a distance between the substrate 210 and the deposition source 100, a size of the substrate 210, and a deposition amount. It is preferable that the minimum determined angle (θ) is about 43°-53°. When the minimum determined angle (θ) of the deposition material DM is less than 43°, the shadow phenomenon in which the deposition material penetrates between the deposition mask 220 and the substrate 210 may be generated. When the minimum determined angle (θ) is more than 53°, the amount of the deposition material is too small, thereby decreasing deposition efficiency. Unless otherwise specifically stated, the determined angle (θ) and any angles related thereto are determined with reference to the first direction.

When an area where the deposition material DM is deposited on the substrate 210 with a predetermined thickness is referred to as a deposition area, the deposition area has outermost positions N1 and N2 in the first direction (the y-axis direction), as shown in FIG. 4. If the minimum incident angle of the deposition material DM is referred to as minimum determined angle (θ), when an arbitrary line having the oblique angle θ corresponding to the minimum incident angle is extended from the position N1 on the substrate 210 toward the deposition apparatus 100, the arbitrary line contacts the deposition apparatus at a position P2, as illustrated in FIG. 4. Similarly, when an arbitrary line having the angle θ is extended from the position N2 on the substrate 210 toward the deposition apparatus 100, the arbitrary line contacts the deposition source 100 at a position P1. The area between the positions P1 and P2 on the deposition source 100 is defined as the center area 102 of the deposition apparatus 100, and an area outside the center area 102, i.e., left of position P1 and right of position P2 in FIG. 4, is defined as the outer areas 104, e.g., area 104a left of position P1 and area 104b right of position P2.

The first spray nozzles 112 formed at the center area 102 have an incident angle that is larger than or equal to θ for any position of the deposition area between the positions N1 and N2. On the other hand, the first spray nozzles 112 formed at the outer area 104 have smaller incident angles than angle θ, as shown in FIG. 4.

The first spray nozzles 112 formed at the center area 102 may spray the deposition material DM for the incident angle of the deposition material to be larger than or equal to the minimum incident angle θ for any position of the deposition area between the positions N1 and N2. On the other hand, the spray nozzles formed at the outer area determined outside the position P2 have smaller incident angles θ' and θ'' than the predetermined minimum incident angle θ as shown in FIG. 4. The incident angle of the spray nozzles disposed in the outer area 104b is small such that the spray nozzle is only disposed in the central area 102 for the incident angle to be more than a predetermined angle.

As described above, since the deposition material is sprayed in all directions of the front side of the end cross-section of the spray nozzle, as shown in FIG. 3, an oblique angle (φ) between the end cross-section of the spray nozzle and the substrate 210 becomes the incident angle (θ) at which the deposition material is incident to the substrate 210. Accordingly, the second spray nozzles 114 disposed at the outer area 104b are disposed for the end cross-section to be toward an outer direction of the deposition source 100. That is, when the determined incident angle (θ) is included in the range of 43-53°, the end cross-section of the spray nozzle may be formed for the oblique angle (φ) with the surface of the substrate 210 to be included in the range of 43-53°. Also, if the angle (λ) of 18° corresponding to the area A is considered, the end cross-section of the spray nozzle may be formed for the oblique angle with the surface of the substrate 210 to be included in the range of 25-35°. The second spray nozzles 114 may have a different oblique angle while having an oblique angle included in the above range.

Figure 5:
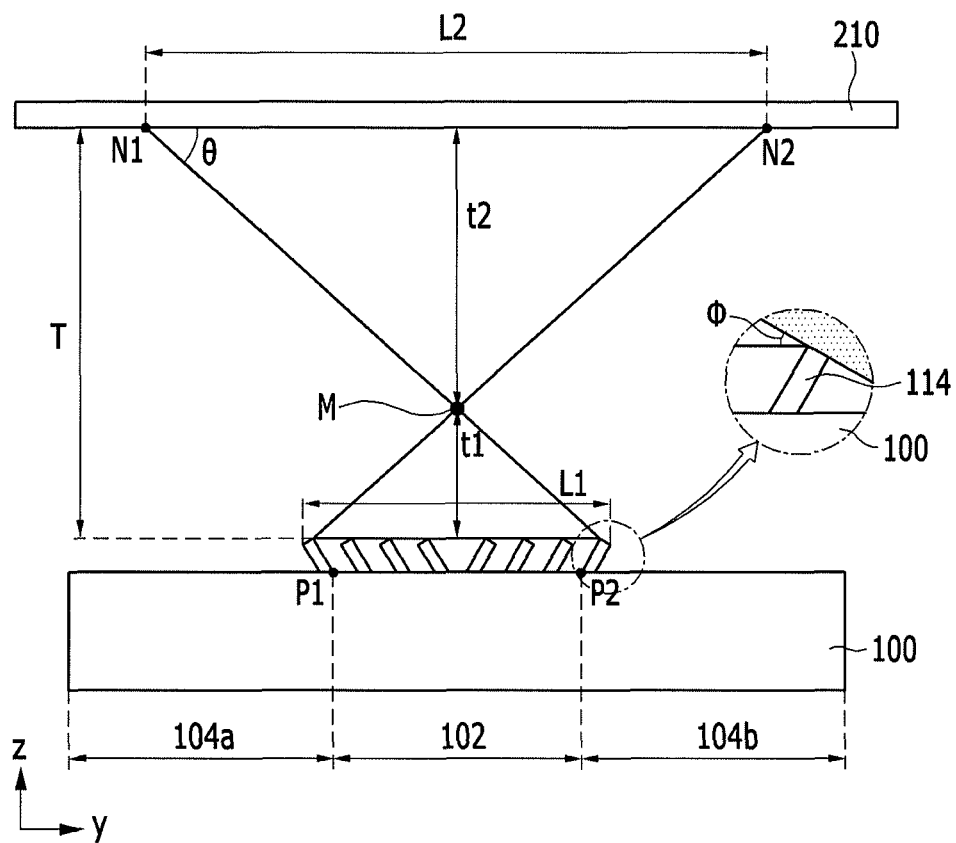
FIG. 5 is a schematic view of a method of determining a center area and an outer area in a deposition apparatus according to an exemplary embodiment.

A method of determining the size of the center area 102 and the outer area 104 of the deposition source 100 will be described with reference to FIG. 5. FIG. 5 is a schematic view of a method of determining the center area 102 and the outer area 104 in the deposition apparatus 100.

Referring to FIG. 5, the substrate 210 and the deposition source 100 are positioned in parallel to face each other, so centers thereof, e.g., as determined along the first direction, are aligned, e.g., the center of the substrate 210 is aligned with the center of the deposition source 100. As illustrated in FIG. 5, a length of the center part 102 of the deposition source 100 along the first direction is referred to as L1, and a length of the predetermined deposition area, i.e., center, of the substrate 210 along the first direction, i.e., distance between points N1 and N2, is referred to as L2. Further, a distance between the substrate 210 and outermost edges of the spray nozzles 110 is referred to as T, the predetermined incident angle is referred to as θ, an intersection point of segments N1P2 and N2P1 is M, a distance between the cross point M and outermost edges of the spray nozzles 110 is referred to as t1, and a distance between the cross point M and the substrate 210 is referred to as t2. It is noted that the outermost edges of the spray nozzles 110 refer to edges that are farthest from the deposition source 100 and closest to the substrate 210.

$$L_1 = \frac{2t_1}{\tan\theta} \qquad \text{Equation 1}$$

Based on FIG. 5, Equation 1 defines L1 in terms of t1 and θ. As t1+t2=T, and if t1=T−t2 is substituted into Equation 1, Equation 2 may be represented as follows.

$$L_1 = \frac{2(T - t_2)}{\tan\theta} \qquad \text{Equation 2}$$

Based on FIG. 5, Equation 3 defines t2 with respect to L2 and θ, as follows.

$$t_2 = \frac{L_2 \tan\theta}{2} \qquad \text{Equation 3}$$

If Equation 3 is substituted into Equation 2, Equation 4 may be represented as follows.

$$L_1 = \frac{2T}{\tan\theta} - L_2 \qquad \text{Equation 4}$$

That is, the length L1 in the first direction of the central area 102 may be represented by a relation equation related to the predetermined oblique angle (θ), the distance (T) between the substrate 210 and the spray nozzles 112 and 114, and the deposition area length L2 in the substrate 210. The remaining portion corresponding to the length L1 in the first direction of the center area 102 in the deposition source 100 becomes the outer areas 104a and 104b.

Figure 6:
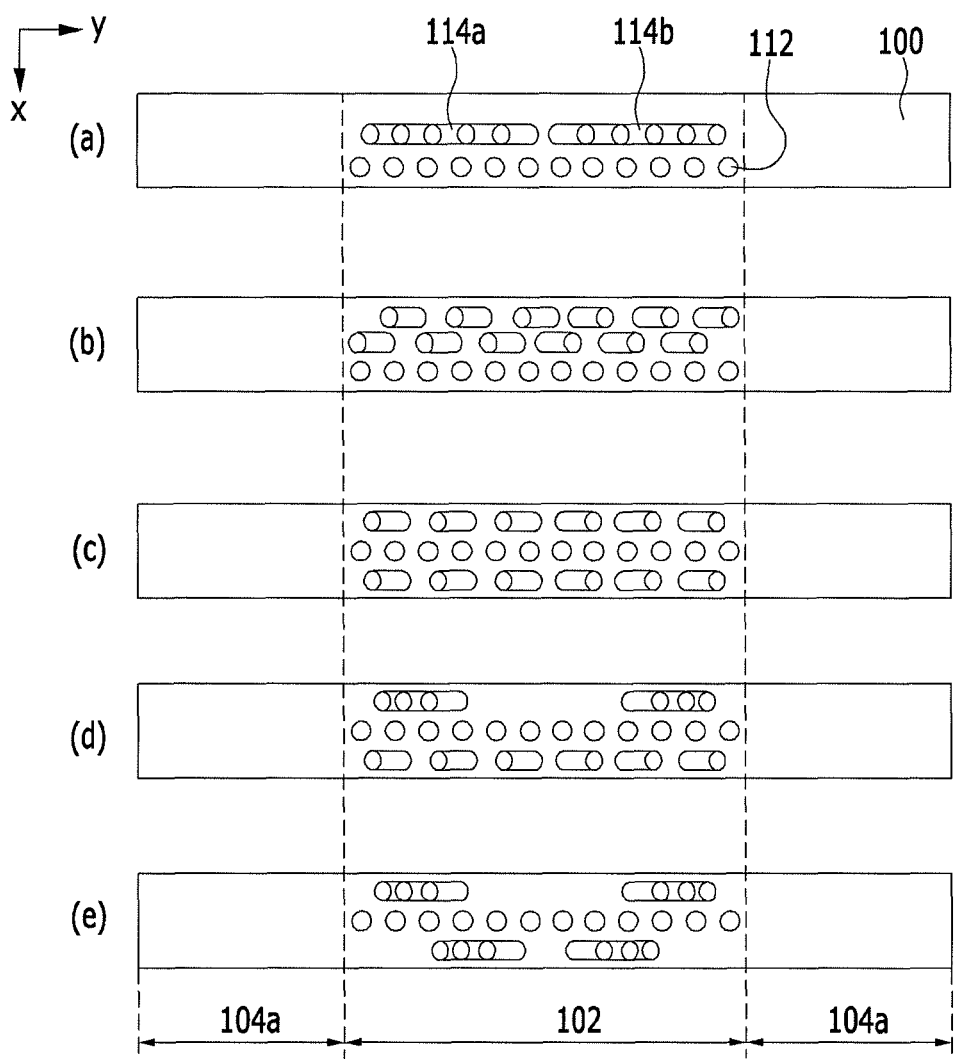
FIG. 6 is a schematic view of an exemplary variation for an arrangement of a spray nozzle in a deposition apparatus according to an exemplary embodiment.

FIG. 6 is a schematic view of an exemplary variation of an arrangement shape of a spray nozzle in a deposition apparatus according to an exemplary embodiment.

The spray nozzles 110 include the first spray nozzles 112, e.g., arranged in a first column, in the first direction and the second spray nozzles 114, e.g., arranged in a second column, in the first direction. The first column and the second column may be parallel and spaced apart in the second direction (the x-axis direction) crossing the first direction.

For example, the second spray nozzles 114 may include a first grouping 114a and a second grouping 114b, so the spray nozzles in the first grouping 114a are directed toward a first direction and the spray nozzles in the second grouping 114b are directed to a second direction different than the first direction, as illustrated in FIG. 1. The first and second groupings 114a and 114b may be aligned in a same column and may be spaced apart from each other in the first direction.

For example, the first spray nozzles 112 may form the first column, and the second spray nozzles 114a and 114b may form the second column while being disposed toward the outside of the deposition source, as shown in FIG. 6(a). In another example, the second spray nozzles 114a and 114b may be formed in two or more columns, as shown in FIG. 6(b)-(e). The second spray nozzles 114a and 114b may be arranged not overlap each other in the second direction, as shown in FIG. 6, or may be arranged to align or overlap with each other in the second direction, as shown in FIG. 6(c). Also, the second spray nozzles 114a may be arranged in a plurality of groupings and closer to a left side, and the second spray nozzles 114b may arranged in a plurality of groupings and closer to a right side as shown in FIGS. 6(d)-(e). The second spray nozzles 114a and 114b are not limited to the arrangements of FIG. 6, and may be arranged in any suitable pattern.

Figure 7:
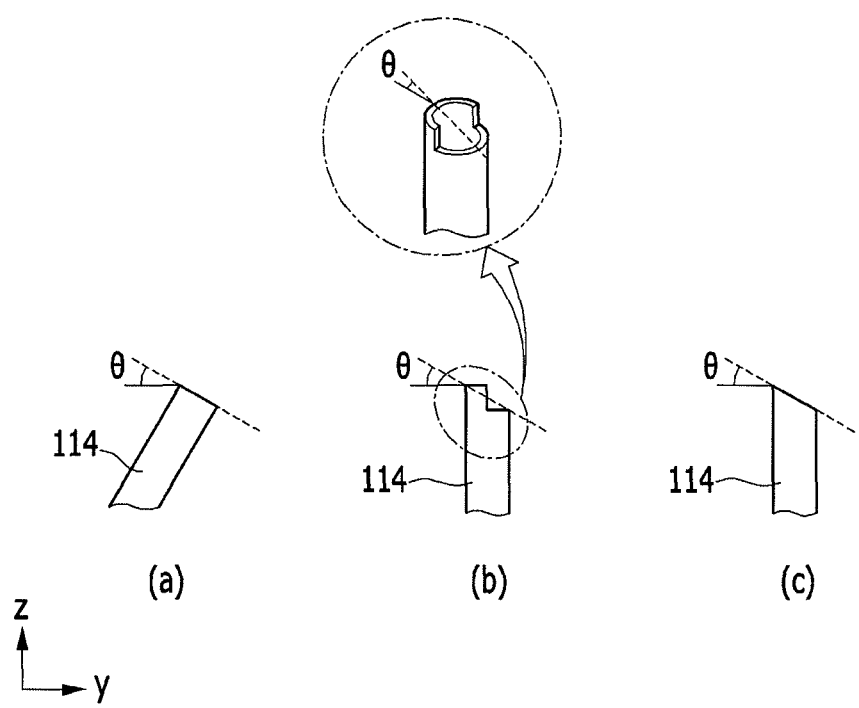
FIG. 7 is a side view of an exemplary variation of a spray nozzle of a deposition apparatus according to an exemplary embodiment.

FIG. 7 is a side view of an exemplary variation of a spray nozzle of a deposition apparatus according to an exemplary embodiment.

Referring to FIG. 7(a), for the spray nozzle 114 disposed at the outer areas 104a and 104b, the direction of the spray nozzle 114 is inclined. That is, the tube-shaped portion may be inclined to have the opening, i.e., the edge of the cross-section of the nozzle spray, at an oblique angle (θ) with the surface of the substrate 210.

Referring to FIG. 7(b), the spray nozzle 114 may be disposed vertically, i.e., perpendicularly, with respect to the substrate 210. However, the shape of the end is asymmetrical, e.g., one half of a tube may be higher than another half of the tube, such that the spray amount in the first direction may be different. When an imaginary line contacting the end in the first direction is extended, the angle of the line may have the oblique angle (θ) with the surface of the substrate 210.

Referring to FIG. 7(*c*), the spray nozzle 114 may be disposed vertically to the substrate 210. However, the end cross-section may have the oblique angle (θ) with the surface of the substrate 210. The spray nozzle 114 is not limited to the embodiments, e.g., the shape of the spray nozzle 114 or the angle of the end cross-section of the spray nozzle 114 may be changed to be inclined in the first direction, and the spray nozzle may be variously changed and realized.

Next, referring to the accompanying drawings, an operation of the deposition apparatus and a manufacturing method of an OLED display according to an exemplary embodiment will be described.

First, the substrate 210 is inserted into the vacuum chamber (not shown), and the substrate 210 is disposed to face the deposition source 100 that emits the deposition material. At this time, the distance between the deposition source 100 and the substrate 210 is controlled for the deposition material to be incident at the predetermined incident angle (θ). The substrate 210 may be disposed to satisfy Equation 4.

The deposition material is sprayed through the spray nozzle 110 while the deposition source 100 is moved in the second direction (the x-axis direction) crossing the first direction. The first spray nozzle 112 arranged at the central area 102 sprays the deposition material with the minimum oblique angle θ in the first direction, and as shown in FIG. 5, the deposition material is sprayed with the incident angle of a size that is larger than or equal to the oblique angle θ to be attached to the substrate 210.

This deposition material preferably is an organic emission layer in the OLED display, e.g., an organic material forming subpixels representing R (red), G (green), and B (blue).

According to an exemplary embodiment, by increasing the incident angle of the deposition material deposited on the substrate, the shadow phenomenon, in which the deposition material penetrates between the deposition mask and the substrate, may be suppressed and the deposition margin may be reduced. Therefore, the deposition uniformity and efficiency may be increased. Accordingly, the high resolution of the OLED display may be easily realized.

In contrast, in a conventional flat panel display, e.g., in the conventional OLED display, an organic material or a metal used as the electrode may be deposited by a vacuum deposition method, e.g., a corresponding material may be deposited in a vacuum atmosphere to form a thin film on a flat plate. For example, a substrate supporting an organic or metal thin film may be positioned in a vacuum chamber, a fine metal mask (FMM) having a desired pattern, i.e., a pattern to be formed on the thin film, may be disposed on the substrate, and the organic or metal material may be evaporated or sublimated, e.g., via a deposition source unit, to be deposited on the substrate. However, a shadow phenomenon, e.g., when the organic material penetrates between the deposition mask and the substrate according to a spraying angle of the deposited material, may occur.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A deposition apparatus, comprising:
a deposition source containing a deposition material, the deposition source including a center area between two outer areas along a first direction, a combined length of the two outer areas along the first direction being larger than half a total length of the deposition source along the first direction; and
a plurality of spray nozzles arranged only on the center area of the deposition source along the first direction to spray the deposition material toward a surface of a substrate,
wherein the plurality of spray nozzles include first spray nozzles and second spray nozzles arranged parallel to the first spray nozzles along the first direction, the first spray nozzles having terminal ends thereof parallel to and facing the surface of the substrate, and the second spray nozzles having terminal ends thereof at an oblique angle with respect to the surface of the substrate, and
wherein the second spray nozzles include first and second groupings of the second spray nozzles, the second spray nozzles in the first grouping leaning away from the second grouping, and the second spray nozzles in the second grouping leaning away from the first grouping.

2. The deposition apparatus of claim 1, wherein centers of the substrate and the deposition source in the first direction are aligned, the center area of the deposition source having a length L1 in the first direction as follows:

$$L1 = \frac{2T}{\tan\theta} - L2$$

wherein L2 is a deposition area length on the substrate in the first direction, T is a distance between the substrate and the terminal ends of the spray nozzles, and θ is an incident angle between the deposition material and the substrate, and
wherein L2 is at least twice longer than L1.

3. The deposition apparatus of claim 1, wherein an incident angle between the deposition material and the substrate is about 43° to about 53°.

4. The deposition apparatus of claim 3, wherein the oblique angle is about 25° to about 35°.

5. The deposition apparatus of claim 1, wherein the plurality of spray nozzles include:
a first column of the first spray nozzles arranged in the first direction; and
at least one second column of the second spray nozzles arranged in the first direction, the first column and the second column being parallel and spaced apart in a second direction crossing the first direction.

6. The deposition apparatus of claim 1, wherein the plurality of spray nozzles are symmetrically arranged in the first direction with respect to the center area of the deposition source.

7. A method manufacturing an organic light emitting diode (OLED) display, the method comprising:
providing a deposition apparatus according to the claim 1;
disposing the substrate to face the spray nozzles: and
spraying the deposition material through the spray nozzles toward the substrate, while moving the deposition source in a second direction crossing the first direction.

8. The method of claim 7, wherein disposing the substrate includes aligning centers of the substrate and deposition source in the first direction, the center area having a length L1 in the first direction as follows:

$$L_1 = \frac{2T}{\tan\theta} - L_2$$

wherein L2 is a deposition area length on the substrate in the first direction, T is a distance between the substrate and the terminal ends of the spray nozzles, and θ is an incident angle between the deposition material and the substrate.

9. The method of claim 7, wherein an incident angle between the deposition material and the substrate is formed to be about 43° to about 53°.

10. The method of claim 9, wherein the oblique angle is formed to be about 25° to about 35°.

11. The method of claim 7, wherein the plurality of spray nozzles includes:
a first column of the first spray nozzle arranged in the first direction; and
a second column of the second spray nozzle arranged in the first direction, the first column and the second column being parallel and spaced apart in the second direction crossing the first direction.

12. The method of claim 7, wherein the plurality of spray nozzles are symmetrically arranged in the first direction with respect to the center of the deposition source.

13. The deposition apparatus of claim 1, wherein the first and second groupings of the second spray nozzles are separated from each other in the first direction within a same column of the second spray nozzles.

14. The deposition apparatus of claim 13, wherein the first and second groupings of the second spray nozzles are symmetrical with respect to a center of the deposition source.

15. The deposition apparatus of claim 13, wherein the second spray nozzles within each of the first and second groupings face a same direction.

16. The deposition apparatus of claim 1, wherein the second spray nozzles in each of the first and second groupings are directed away from a center of the substrate.

17. A deposition apparatus, comprising:
a deposition source containing a deposition material, the deposition source including a center area between two outer areas along a first direction, a combined length of the two outer areas along the first direction being larger than half a total length of the deposition source along the first direction; and
a plurality of spray nozzles arranged only on the center area of the deposition source to spray the deposition material toward a surface of a substrate,
wherein the plurality of spray nozzles include a plurality of first spray nozzles and a plurality of second spray nozzles, the first spray nozzles having terminal ends thereof parallel to and facing the surface of the substrate, and the second spray nozzles having terminal ends thereof at an oblique angle with respect to the surface of the substrate,
wherein the second spray nozzles include a third spray nozzle and a fourth spray nozzle, the terminal ends of the third spray nozzle and the fourth spray nozzle having different oblique angles with respect to the surface of the substrate,
wherein the first spray nozzles are arranged along a first line and the third spray nozzle and the fourth spray nozzle of the second spray nozzles are arranged along a second line, and
wherein the first line and the second line are spaced from each other and extend in the first direction.

18. The deposition apparatus of claim 17, wherein centers of the substrate and the deposition source in the first direction are aligned, the center area of the deposition source having a length L1 in the first direction as follows:

$$L1 = \frac{2T}{\tan\theta} - L2$$

wherein L2 is a deposition area length on the substrate in the first direction, T is a distance between the substrate and the terminal ends of the spray nozzles, and θ is an incident angle between the deposition material and the substrate.

19. The deposition apparatus of claim 17, wherein an incident angle between the deposition material and the substrate is about 43° to about 53°.

20. The deposition apparatus of claim 19, wherein the oblique angle is about 25° to about 35°.

* * * * *